United States Patent [19]

Lehr

[11] Patent Number: 5,281,918
[45] Date of Patent: Jan. 25, 1994

[54] SAMPLE HEAD FOR NMR TOMOGRAPHY

[75] Inventor: Heinrich Lehr, Ettlingen, Fed. Rep. of Germany

[73] Assignee: Bruker Medizintechnik GmbH, Fed. Rep. of Germany

[21] Appl. No.: 832,707

[22] Filed: Feb. 7, 1992

[30] Foreign Application Priority Data

Feb. 11, 1991 [DE] Fed. Rep. of Germany ....... 4104079

[51] Int. Cl.$^5$ .............................................. G01V 3/00
[52] U.S. Cl. .................................... 324/318; 324/322; 128/653.5
[58] Field of Search ............... 324/300, 307, 309, 318, 324/322; 128/653.5

[56] References Cited

U.S. PATENT DOCUMENTS 4,616,181 10/1986 Kemner et al. ..................... 324/318
4,727,328 2/1988 Carper et al. ....................... 324/318
4,939,465 7/1990 Biehl et al. ........................... 324/318

FOREIGN PATENT DOCUMENTS 0374994 11/1989 European Pat. Off. .
3522401 6/1985 Fed. Rep. of Germany .
PCT/DE90/-
  00479 6/1990 PCT Int'l Appl. .

Primary Examiner—Louis Arana
Attorney, Agent, or Firm—Claude A. S. Hamrick

[57] ABSTRACT

A sample head for the NMR tomography is disclosed. The sample head has at least two hollow-cylindrical housings, arranged beside each other along a common axis. Each of the housings has an outer cylindrical wall consisting of essentially continuous, electrically conductive material and has an inner cylindrical wall surrounding a sample area. The inner cylindrical walls are provided with a plurality of parallel electrical conductors extending parallel to an axis of the sample head. The sample head, further, has a coupling device for generating rf electrical currents within the conductors.

11 Claims, 4 Drawing Sheets

SAMPLE HEAD FOR NMR TOMOGRAPHY

The invention concerns a sample head for NMR tomography with at least one hollow cylindrical housing, whose outer cylindrical casing consists of essentially continuous, electrically conductive material, and whose inner cylindrical casing, which surrounds a sample space, is provided with a plurality of parallel electrical conductors running axially, and with at least one coupling arrangement to generate high-frequency electrical currents in the conductors.

A sample head of the aforesaid type is known from DE-OS 35 22 401.

The known sample head is provided for nuclear magnetic resonance tomographs whose measurement frequency is on the order of 100 MHz. The aforesaid arrangement results in a distribution of the high-frequency magnetic field in the sample space of the sample head in which the field lines run essentially parallel to one another and in a radial plane. The homogeneity of the high-frequency magnetic field is thus very good. The fact that all of the field lines run in a radial plane also ensures that the high-frequency magnetic field runs perpendicular to the axis of the sample head, so that the sample head can be arranged coaxially with a solenoid coil that generates the constant magnetic field needed to excite nuclear magnetic resonance.

The general development trend in the area of nuclear magnetic resonance tomographs, however, is to develop tomographs for higher and higher measurement frequencies, for example frequencies of 300 MHz or even above.

In this frequency range, however, the known sample head referred to earlier encounters technological barriers. For example, the leakage fields in particular increase at high frequency, which leads to degraded quality. Moreover, in elongated sample heads of the type mentioned earlier, the intensity of the high-frequency magnetic field decreases in the axial direction from the center towards the outside, so that for volume-selective measurements, the differing amplitude of the high-frequency magnetic field associated with changes in the axial position of the measurement volume must be taken into account.

EP-OS 0 342 745 discloses a nuclear spin examination device with a high-frequency coil arrangement. In this known device, improved quality and sensitivity are intended to be achieved by the fact that the coil consists of individual resonators tuned to the same resonance frequency, which are merely coupled together inductively but are not galvanically interconnected.

In this known device, distortion of the field as one moves axially away from a central coil is balanced by the fact that additional coils are arranged axially spaced away from the central coil, although these additional coils are wired as passive resonant circuits. These passive resonant circuits then pick up the magnetic field generated by the active center coil and "elongate" it axially, so that the field lines emerging axially from the active center coil run linearly, as is possible in the absence of the additional passive resonant circuit coils.

The known device is only suitable, however, for relatively low measurement frequencies, which in the aforesaid published European Patent application are indicated as 8.5 MHz. Only at these relatively low measurement frequencies can circular coil arrangements be used to generate the desired high-frequency magnetic field. Such coil arrangements are no longer usable at higher measurement frequencies of, for example, 50 MHz or more.

Furthermore, the known device has the disadvantage that the passive resonant circuit coils must each be individually tuned to the prevailing resonant frequency of the active central resonant circuit arrangement. This entails extreme complexity which is nevertheless required because if the, for example, four or eight additional coil arrangements are not precisely tuned, inhomogeneities rather than improved homogeneity would result. EP-PS 0 107 238 discloses a nuclear magnetic resonance tomograph in which high-frequency saddle coils are used to generate the high-frequency magnetic field.

With this known device, one alternative provision is for a plurality of saddle-type subcoils to be arranged axially behind one another or circumferentially next to one another. Provision is also made, in an arrangement with a plurality of axially adjacent saddle coils, for the respective individual coils to be supplied with power from a common high-frequency source in a parallel circuit.

This known arrangement is once again suitable only for relatively low measurement frequencies, which in the aforesaid European Patent document are indicated as 9 MHz but a maximum of 20 MHz.

In this known tomograph, although the entire coil arrangement is actively supplied with high-frequency current due to the parallel wiring of the individual saddle coils, this can nevertheless lead to interactions among the individual coils, since they are closely coupled to one another.

The object on which the invention is based is therefore to develop a sample head of the aforesaid type in such a way that, at considerably high measurement frequencies up to (typically) 300 MHz or more, tomography measurements are possible with a highly consistent high-frequency magnetic field and a high fill factor.

This object is achieved, according to the invention, by the fact that at least two subhousings are arranged with an axial shift with respect to one another; and that each subhousing is provided with the conductors.

Specifically, the use of a plurality of subhousings that are arranged axially next to one another but are coaxial increases overall homogeneity, since the edge falloff of the high-frequency magnetic field within each subhousing is less than the edge falloff with a continuous elongated housing. Furthermore, separate adjustability of the high-frequency currents means that defects typical of the known arrangements can be eliminated. These include, in particular, the phase defects that are unavoidable with the known arrangements, for example due to different loads on the individual coils. It must be remembered in this connection that sample heads of the type at issue here are designed to accommodate either entire human bodies or at least entire limbs of human bodies, in other words test objects that are highly inhomogeneous. Such inhomogeneities can be compensated for only if, according to the invention, high-frequency magnetic fields—which, due to the separate adjustability of the high-frequency currents, are also separately adjustable—can be generated within the individual subhousings. It is then unnecessary to make any compensation for larger-scale tomographic measurements extending over large axial regions.

What is of primary importance, however, is that when a plurality of subhousings are used, the reduction in electrical leakage fields makes the overall quality of the arrangement much greater—even at very high measurement frequencies—than would be the case with a unitary, continuous arrangement.

In a preferred embodiment of the invention, the high-frequency currents in the subhousings are adjustable independently of one another. In particular, the high-frequency currents are intended to be manually or automatically adjustable while the sample head is in operation.

This feature, which can be achieved, for example, by the fact that each subhousing has a separate excitation facility, has the advantage that, depending on the measurement task, the electromagnetic oscillations inside the sample spaces of the two subhousings can be adjusted individually.

Because of the rigorous decoupling of the two subhousings, it is thus possible to operate each individual subhousing individually in order to achieve special measurement effects, while maintaining this geometrical decoupling.

This is also reflected in an increase in fill factor, since the ratio between sample volume (or measurement volume for volume-selective measurements) and the volume of the respective sample space becomes more favorable if two subspaces are considered in isolation. For example, it is also optionally possible with the sample head according to the invention to operate only one of the two subhousings actively and to switch off the other, if the only measurement volumes of interest are in the sample space of the first subhousing.

Although in the context of the present invention, the number, type, and arrangement of the subhousings could in principle be freely selected, embodiments in which only two subhousings are provided, and/or in which the subhousings are identical in structure, and/or in which the subhousings are arranged with an axial gap between them and/or the axial gap is considerably less than one axial length of the subhousing or disappears entirely, are preferred.

One especially preferred embodiment of the sample head according to the invention is characterized in that the high-frequency electrical currents are adjustable in such a way that high-frequency alternating magnetic fields, whose field lines run parallel to one another in a radial plane in each individual sample space, are generated in the sample spaces enclosed by the subhousings.

In this connection, the field lines of the alternating field in one sample space are preferably oriented orthogonally to the field lines of the alternating field in the respective axially adjacent sample space. Moreover, it is especially preferred in this connection if high-frequency circularly polarized alternating magnetic fields are generated in the sample spaces enclosed by the subhousings.

The result of this feature is that the high-frequency magnetic fields of the two subhousings can be rigorously decoupled from one another geometrically, since the respective field lines are at 90° to one another.

This reason this is possible with sample heads of the aforementioned type is because oscillation modes in which the spatial orientation of the electric field lines is adjustable in the aforesaid manner can be generated only with such sample heads.

The result is that the two subhousings on the one hand are electrically decoupled from one another, but on the other hand are equivalent or even superior to a one-piece sample head in terms of tomography measurements.

Also preferred is an embodiment of the invention in which the conductors, with the exception of defined gaps, are arranged at positions distributed uniformly over one circumference of the subhousing, with the gaps being located at a minimum of two positions lying on a common diameter of a radial plane.

The advantage of this feature is that the orientation of the oscillation modes within the two subhousings is additionally stabilized, since the "gaps" define the orientation of the field lines.

If, as explained above, the oscillation modes inside the two subhousings are to be oriented orthogonally to one another, this orthogonality can be reinforced and stabilized by the fact that the gap positions within the two subhousings are also arranged at a 90° offset to one another.

Further advantages are evident from the description and the attached drawings.

It is understood that the features mentioned above and those yet to be explained hereinafter can be used not only in the particular combination indicated, but also in other combinations or in isolation, without leaving the context of the present invention.

Exemplary embodiments of the invention are depicted in the drawings, and will be explained in more detail in the description which follows. In the drawings.

Figure 1:
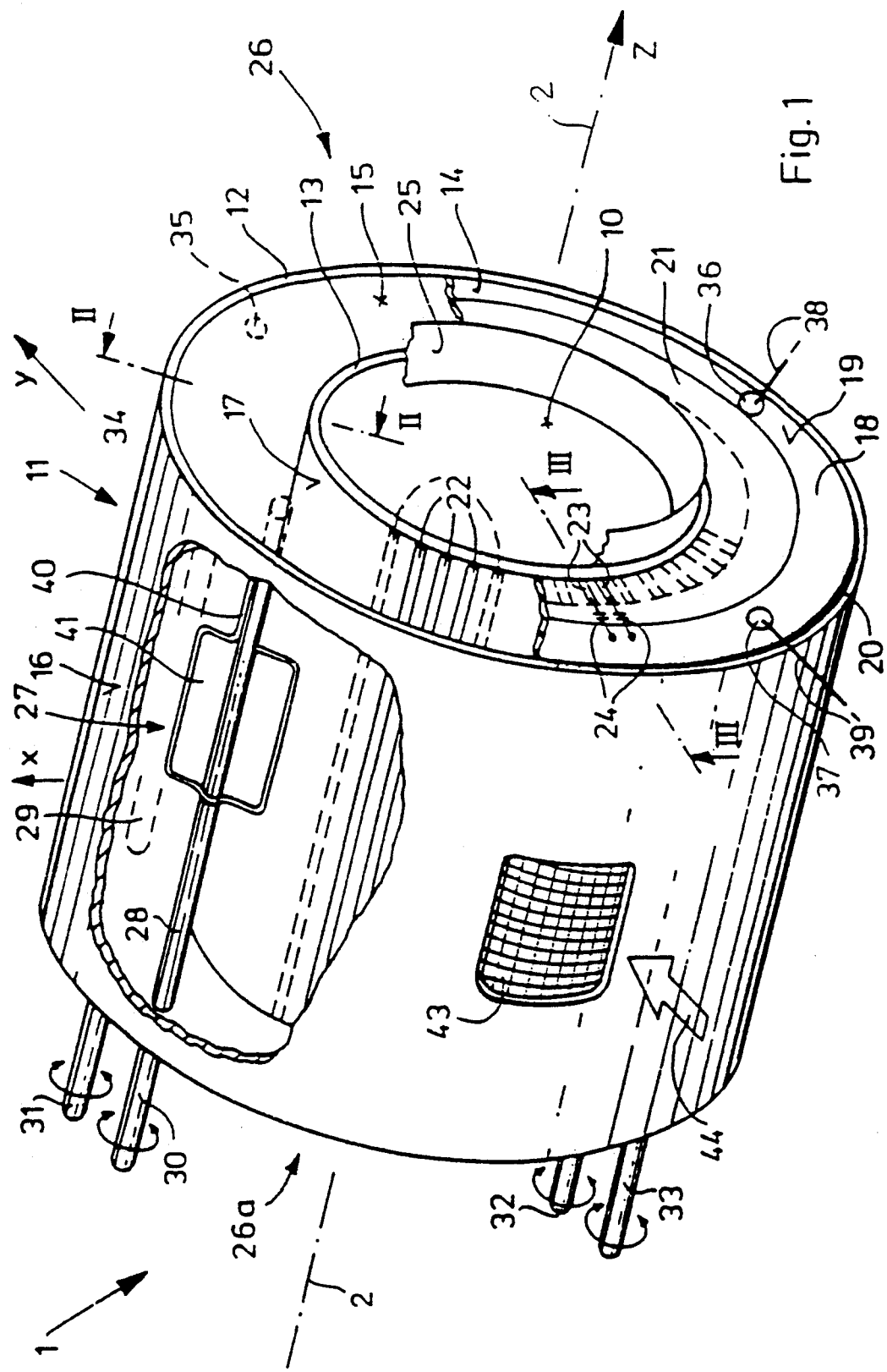
FIG. 1 is a perspective view, partly cut away, through a sample head according to the prior art.

In FIG. 1, 1 designates the entirety of a sample head for NMR tomography. The longitudinal axis of the essentially cylindrical sample head 1 is designated 2. It is a known process to use such sample heads 1 for NMR tomography in a static magnetic field of high strength and homogeneity, whose orientation coincides with the axis 2 of the sample head 1.

A sample, especially a living sample, for example a head or limb or an entire body of a person or an animal, is placed in a sample space 10 of the sample head 1 and therein exposed to a high-frequency magnetic field that extends essentially perpendicular to the axis 2 of the constant magnetic field. Sample heads 1 for NMR tomography are therefore generally used to irradiate onto the sample a high-frequency magnetic field that is oriented perpendicular to the direction of the constant magnetic field and is as homogeneous as possible.

The sample head 1 according to FIG. 1 is of a known design. Details of the sample head 1 are described in DE-OS 35 22 401, the disclosure of which is also, by means of this reference, made part of the disclosure of the present application.

The sample head 1 comprises a hollow cylindrical housing 11 with an outer casing 12 and an inner casing 13, as well as end surfaces 14 that span the gap 15 between the casings 12, 13.

The surface 16 of the outer casing 12 is electrically conductive. The end surfaces 14 are subdivided radially. An outer circular region 18 has a surface 19, also electrically conductive, that is joined by means of a circumferential soldered joint 20 to the conductive surface 16 of the outer casing 12. An inner region 21 of the end surfaces 14 is, however, not conductive.

The conductive surface 17 of the inner casing 13 is electrically conductive only in a direction parallel to the axis 2 of the housing 11, because it is subdivided into axial conductors 22. Each of the conductors 22 is joined to a radially oriented conductive strip 23 on the inner region 21 of the end surfaces 14. Capacitors 24 lead from the strips 23 to the outer, conductive region 18 of the end surface 14.

In the region of the end surface 14, a tubular section 25, which is also electrically conductive and can be displaced in the direction of the axis 2, is inserted into the inner casing 13.

The above description referred only to one end face 26 of the sample head 1, but it is understood that the opposite end face 26a, which is not depicted in detail in FIG. 1, is also configured correspondingly, so that overall, the sample head 1 is symmetrical in structure.

Four coupling arrangements distributed over the circumference, only one of which (27) is depicted individually, are provided in order to couple electrical energy into the sample head 1. Rods 28, 29 that pass through the gap 15 parallel to the axis 2 are provided in order to adjust the coupling arrangements 27. At one end the rods 28, 29 extend into handles 30, 31, 32, 33 that can be rotated in the direction of the double arrows 30 shown. The opposite ends of the rods 28, 29 rest in mounts 34, 35, 36, 37 in the opposite end surface 14, with the mounts 34, 35, 36, 37 simultaneously serving as connectors, as indicated at 38 and 39.

From the connectors 38, 39, an axial lead 40 runs to a loop antenna 41 arranged essentially in the axial center of the rods 28, 29. Lastly, an inspection opening 43 is also provided in the outer casing 12, through which it is possible to look into the interior of the sample head 1 and also into the sample space 10 in the direction of an arrow 44.

The casing 12 preferably consists of a support element that is provided with a copper lining. The support element can be made of glass, ceramic, or plastic. A glass-fiber-reinforced plastic having a dielectric constant $\epsilon$ of 3.8 and a loss factor tan $\alpha$ of 0.15 at 50 MHz has proved to be especially suitable. A support element made of glass, ceramic, or plastic can also be used for the inner casing 13; a polyvinyl chloride (PVC) having a dielectric constant $\epsilon$ of 3.5 and a loss factor tan $\alpha$ of 0.03 at 1 MHz has proved to be especially suitable.

In practical exemplary embodiments of the sample head 10, the copper lining of the outer casing 12 consists of a copper sheet 0.3 mm thick that is wound onto the outside of the support element and soldered along a surface line. In one practical exemplary embodiment, a flexible printed-circuit material whose conductive surface consisted of a copper film 35 $\mu$m thick was used as the copper lining of the inner casing 13.

In this manner, a sample head as in FIG. 1 and according to the prior art, 250 mm long and with an outside diameter of ca. 250 cm and an inside diameter of ca. 160 mm, was constructed. One hundred and twenty equidistant conductors 22 were applied onto the inner casing 13 and connected to the end surfaces with a 2.7 pF capacitor at each end, with the known sample head being designed for a measurement frequency of 100 MHz.

Figure 2:
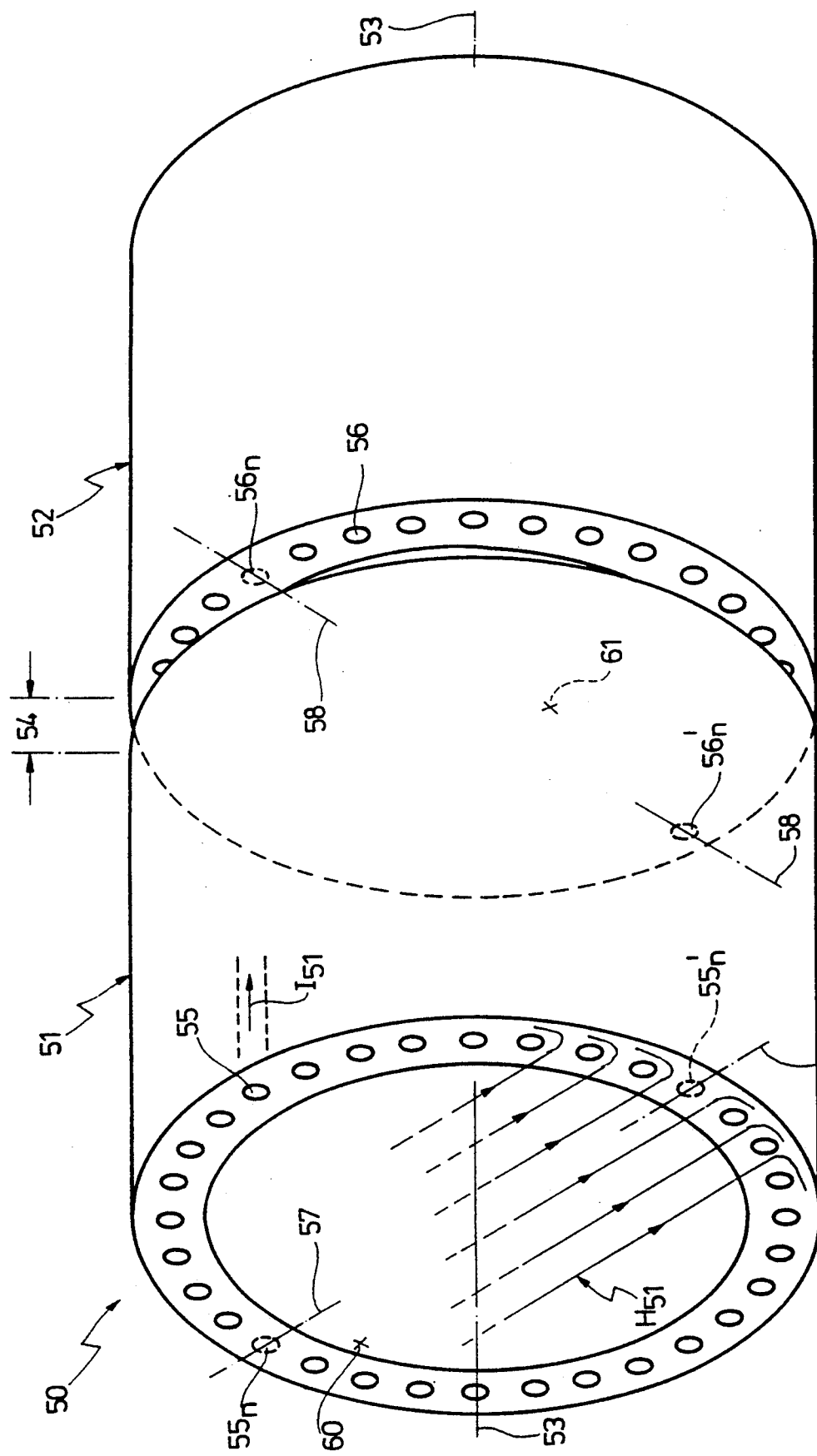
FIG. 2 is a perspective depiction of an exemplary embodiment of a sample head according to the invention.

FIG. 2 in turn shows an exemplary embodiment of a sample head 50 according to the invention, which in contrast to the known sample head 1 in FIG. 1 can be used for considerably higher frequencies (300 MHz).

The sample head 50 according to FIG. 2 consists of two subhousings 51 and 52 which are arranged next to one another along a common axis 53. In the exemplary embodiment depicted in FIG. 2, there is an axial distance 54 between the adjacent end faces of the subhousings 51, 52 which preferably is considerably less than the axial length of the two subhousings 51, 52. Numbers 55 and 56 designate conductor rods in the subhousings 51, 52. These conductor rods 55, 56 perform the function of the axial conductors 22 in the known sample head 1 of FIG. 1. Moreover, the subhousings 51, 52 are constructed on the same principle as the known sample head 1 according to FIG. 1, so that to this extent the description pertinent to FIG. 1 can be referred to.

In the sample head 50 according to FIG. 2, it is preferable if considerably fewer axial conductor rods 55, 56 are distributed over a circumference of the subhousings 51 and 52.

It was mentioned earlier that in one exemplary embodiment of the known sample head 1 according to FIG. 1, 120 equidistant axial conductors 22 were used. However, this quantity is not mandatory even with the exemplary embodiment according to FIG. 1; in fact, it is even possible to use considerably fewer conductors 22, and in extreme cases only two conductors are sufficient.

In the exemplary embodiment of the sample head 50 according to FIG. 2, thirty-two conductor rods 55, 56 are drawn in each case, although it is understood that considerably fewer conductor rods 55, 56, for example eight or sixteen or even only two, can also be used.

For reasons which will be explained in detail later on, it is also preferable if no conductor rods 55, 56 are provided at each of two diametrically opposite positions. These positions, designated in FIG. 2 as 55$n$ and 55$n'$ for subhousing 51 and 56$n$, 56$n'$ for subhousing 52, are thus each located on a common diameter 57 and 58, which are each arranged in a radial plane of the subhousing 51, 52. The two common diameters 57 and 58 of the subhousings 51 and 52 are preferably perpendicular to one another.

Lastly, in FIG. 2 the sample space in the left subhousing 51 is designated 60, and the sample space in the right subhousing 52 is designated 61.

Figure 3:
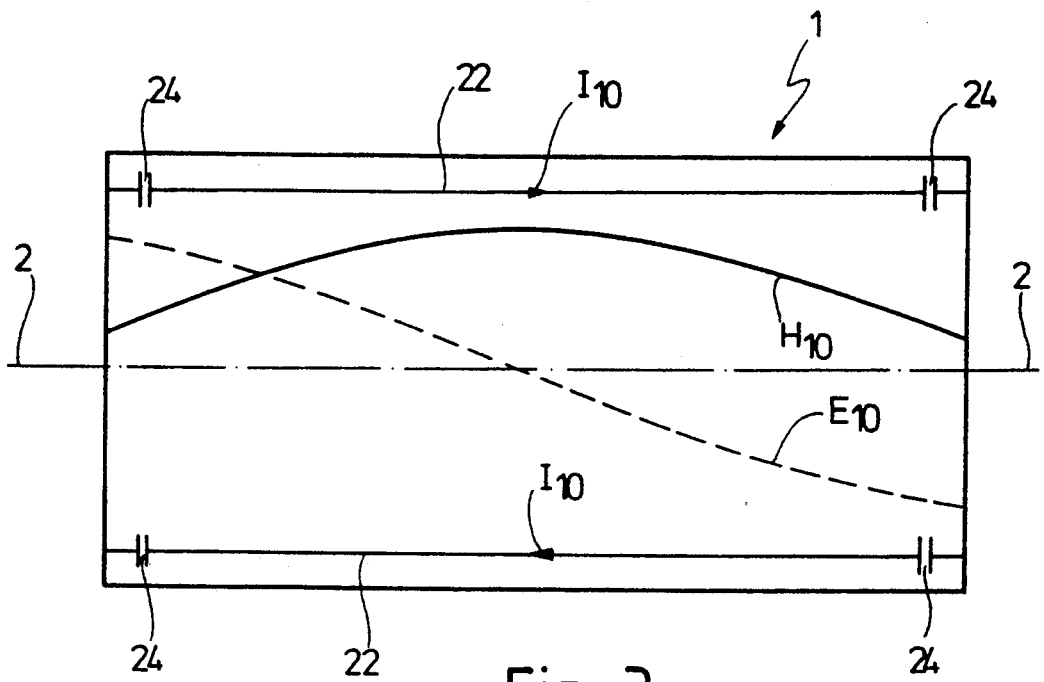
FIG. 3 is a side view, highly schematic and in lengthwise section, through the sample head of FIG. 1.
Figure 4:
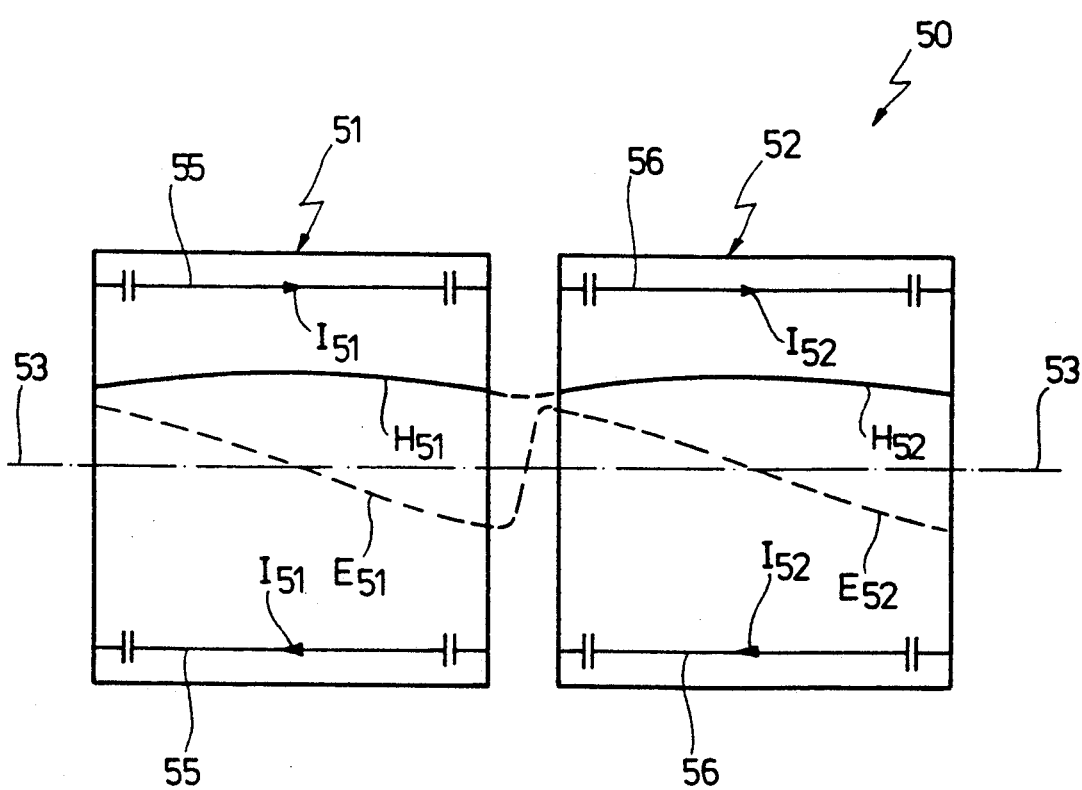
FIG. 4 is a depiction similar to FIG. 1, but for the sample head of FIG. 2.

FIGS. 3 and 4 depict, for comparison, the conditions in terms of high-frequency technology with the previously known sample head 1 according to FIG. 1 (in FIG. 3), and with the sample head 50 according to the invention and FIG. 2 (in FIG. 4). The depictions in FIGS. 3 and 4 each refer to a highly schematized axial section, with the elements depicted having the same reference numbers as in FIGS. 1 and 2.

It is evident from FIG. 3 that a high-frequency current $I_{10}$ flows through the axial conductor 22. This high-frequency current $I_{10}$ results in a profile $H_{10}$ for the high-frequency alternating magnetic field, with the curve $H_{10}$ in each case depicting the amplitude over the axis 2. The dashed line $U_{10}$ depicts the corresponding curve for the high-frequency voltage.

It is evident from FIG. 3 that the curve for field strength $E_{10}$ exhibits a definite falloff towards the axial edge of the sample head 1. This means that with volume-selective measurements, i.e. measurements of isolated small sample spaces, consideration must be given to the fact that the intensity of the high-frequency magnetic field has decreased at the edge of the sample head 1 compared with the center of the sample head 1.

If one then compares the conditions with the sample head 50 according to the invention in FIG. 4, it is evident that a high-frequency current $I_{51}$ passes through the conductor rods 55 in the left half, and a high-frequency current $I_{52}$ through the conductor rods 56 of the right half. The profiles of the high-frequency alternating magnetic field are indicated as $H_{51}$ and $H_{52}$, and the profiles of the electrical leakage field as $E_{51}$ and $E_{52}$.

It is clearly evident from FIG. 4 that the edge falloff in the profiles $H_{51}$ and $H_{52}$ is considerably less than in the case of the sample head 1 according to FIG. 3; the reason is that because of the considerably shorter axial length compared to the high-frequency wavelength, the edge falloff is much less evident.

All in all, this means that greater homogeneity of the high-frequency magnetic field can be achieved, so that when multiple measurements are made at different axial points of the sample in the sample head 50, no compensation actions, or only very few of them, are necessary.

Another consequence of the division of the sample head 50 into two subhousings 51 and 52 is that the "fill factor," i.e. the ratio between sample volume and sample head volume, is more favorable when only a single half of the sample head 50 is being operated.

FIG. 5 once again shows the exemplary embodiment of the sample head 50 according to the invention, in a highly schematic depiction.

Figure 5:
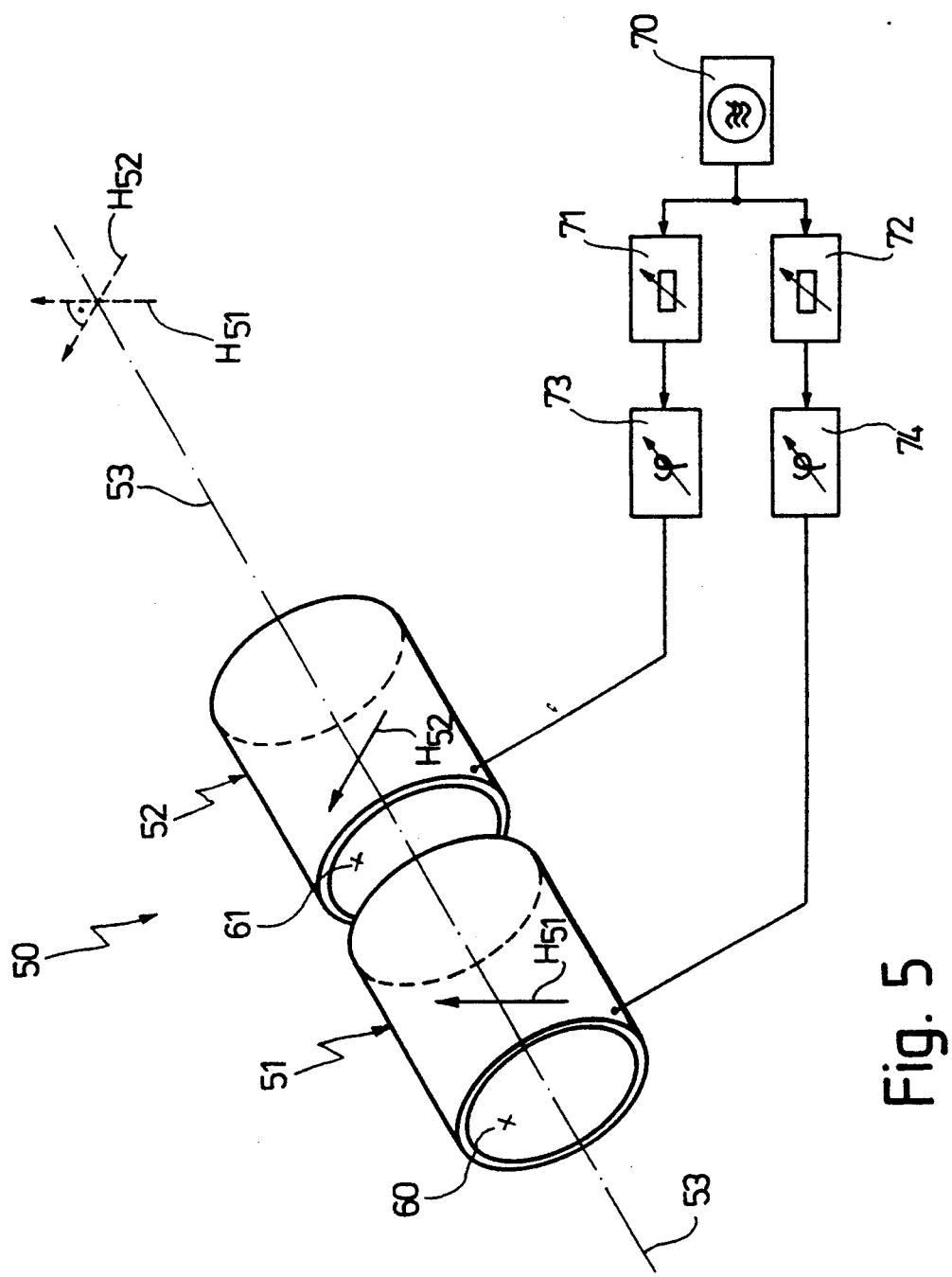
FIG. 5 is a further perspective depiction of an exemplary embodiment of a sample head according to the invention, including a portion of its electrical circuitry.

Both halves of the sample head 50 in FIG. 5 are powered from a common transmitter 70. For this purpose, the transmitter 70 branches at its output and is connected to two attenuators 71, 72. Each attenuator 71, 72 is coupled, via phase shifters 73, 74, to the electrical conductors in the two subhousings 51 and 52.

By means of the two branches with the attenuators 71, 72 and phase shifters 73, 74, it is possible to adjust the high-frequency current $I_{51}$ and $I_{52}$ into the conductor rods 55, 56 of the subhousings 51, 52 separately in terms of magnitude and phase.

The sample head 50, like the known sample head 1 according to FIG. 1, is designed so that a TEM dipole wave can propagate in it. The field distribution of the magnetic field is such that the magnetic field lines permeate the sample space in such a way that they run parallel to one another and in a radial plane. This is depicted in FIG. 2 for the left subhousing 51. A circularly polarized wave can be excited in each of the subhousings 51, 52, in this case without gaps at positions 55n and 55n', and in general with two phase-shifted excitation points at each subhousing 51, 52. Advantageously, the two circularly polarized waves in the two subhousings 51, 52 are phase-shifted through 90°, i.e. the magnetic field lines in the sample space of the first subhousing 51 are at all times perpendicular to those in the sample space of the second subhousing 52. The corresponding oscillations are thus decoupled. Working with circularly polarized waves theoretically results in a factor of 1.4 in the signal-to-noise ratio, and at higher frequencies results in more homogeneous distribution of the magnetic component of the high-frequency field, but is more difficult to manage in practical terms.

Alternatively, however, linearly polarized oscillations can also be excited. It is evident from FIG. 2 that the gaps at positions 55n and 55n'—i.e. the points on the circumference of the subhousing 51 at which no conductor rod 55 is located—define and stabilize the orientation of the magnetic field lines.

The arrangement according to FIG. 5 results in oscillation modes inside the sample spaces 60, 61 which are aligned orthogonally to one another, as indicated by $H_{51}$ and $H_{52}$ in FIG. 5. The field lines of these oscillation modes are thus perpendicular to one another, as shown again at the top right corner of FIG. 5 for clarity.

The excitation phases of the two linearly polarized oscillations in the two subhousings 51 and 52 can be identical, but theoretically any relative phase position can be used. In particular, the phase difference can be 90°. In this case the contributions of the excitations of the individual subhousings 51, 52 are superimposed on one another in the transition region between them, yielding an approximately circularly polarized wave.

In FIG. 5, elements 70 to 74 depict only transmitter elements, but it is understood that corresponding receiver elements or coupled transmitter/receiver elements are provided in order to acquire and process the nuclear magnetic resonance signals being measured. In particular, it is also possible to detect signals in quadrature mode.

It is understood that more than two subhousings can be combined in the manner described, with the oscillation orientations of adjacent subhousings preferably being shifted by 90° with respect to one another.

I claim:

1. A sample head for nuclear magnetic resonance tomography responsive to input rf electromagnetic energy and operative to generate an rf magnetic field with improved axial falloff characteristics, comprising:

a first hollow-cylindrical housing defining an axis and having a first outer cylindrical wall consisting of essentially continuous electrically conductive material, and having, further, a first inner cylindrical wall surrounding a first sample area and being provided with a plurality of electrical conductors extending parallel to said axis;

a second hollow-cylindrical housing having a second outer cylindrical wall consisting of essentially continuous electrically conductive material, and having, further, a second inner cylindrical wall surrounding a second sample area and being provided with a plurality of electrical conductors extending parallel to said axis, said second hollow-cylindrical housing being arranged concentric to and beside said first hollow-cylindrical housing; and coupling means for communicating said rf electromagnetic energy to said head thereby generating rf electrical currents within said electrical conductors, said rf electrical currents generating a first rf magnetic field within said first sample area having field lines oriented in a first direction and extending in parallel to one another in a radial plane of said first housing, and a second rf magnetic field within said second sample area having field lines oriented in a second direction orthogonal to said first direction and extending in parallel to one another in a radial plane of said second housing, each of said rf magnetic fields in each of said housings having an axial amplitude profile with an amplitude falloff at axial edges of said housings, whereby the axial amplitude profile through said first and second sample areas has an amplitude falloff at the axial extremities of said head that is considerably less than that of a single housing sample head of similar design and axial length.

2. The sample head of claim 1, wherein said rf currents are individually adjustable within said first and said second hollow-cylindrical housing, respectively.

3. The sample head of claim 2, wherein said rf currents are manually adjustable while said sample head is in operation.

4. The sample head of claim 2, wherein said rf currents are automatically adjustable while said sample head is in operation.

5. The sample head of claim 1, wherein said first and said second hollow-cylindrical housings are identical in structure.

6. The sample head of claim 1, wherein said first and said second hollow-cylindrical housings are arranged with an axial gap there between.

7. The sample head of claim 6, wherein said axial gap is substantially smaller in length than one of said hollow-cylindrical housings.

8. The sample head of claim 1, wherein said first and said second hollow-cylindrical housings are arranged adjacent to one another.

9. The sample head of claim 1, wherein circularly polarized rf magnetic fields are generated in said sample areas enclosed by said hollow-cylindrical housings.

10. The sample head of claim 1, wherein said conductors, with the exception of defined gaps, are evenly distributed over a periphery of said inner cylindrical walls, said gaps being located at least at two positions lying on a common diameter of an inner cylindrical wall radial plane.

11. The sample head of claim 10, wherein said positions of said gaps of one of said hollow-cylindrical housings are offset by 90° with respect to said positions of said gaps of another of said hollow-cylindrical housings.

* * * * *